(12) United States Patent
Park et al.

(10) Patent No.: US 11,829,204 B2
(45) Date of Patent: Nov. 28, 2023

(54) WINDOW AND DISPLAY DEVICE INCLUDING THE SAME

(71) Applicant: Samsung Display Co., Ltd., Yongin-Si (KR)

(72) Inventors: Youngsang Park, Seoul (KR); Inseok Seo, Asan-si (KR); Hung Kun Ahn, Seongnam-si (KR); Hye-Jin Oh, Seoul (KR); Jang Doo Lee, Hwaseong-si (KR); Jungkyu Jo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 64 days.

(21) Appl. No.: 17/241,610

(22) Filed: Apr. 27, 2021

(65) Prior Publication Data

US 2021/0397222 A1    Dec. 23, 2021

(30) Foreign Application Priority Data

Jun. 18, 2020   (KR) .................... 10-2020-0074368

(51) Int. Cl.
*G09G 5/00*        (2006.01)
*G06F 1/16*        (2006.01)
*H10K 50/84*   (2023.01)
*H10K 59/12*       (2023.01)
*H10K 102/00*      (2023.01)

(52) U.S. Cl.
CPC ........... *G06F 1/1652* (2013.01); *H10K 50/84* (2023.02); *H10K 59/12* (2023.02); *H10K 2102/311* (2023.02)

(58) Field of Classification Search
CPC ............... G06F 1/1637; G06F 1/1652; G06F 2203/04102; G09F 9/301; G09G 3/3208; H01L 27/3244; H01L 51/5237; C08J 7/042; H10K 59/12; H10K 2102/311
See application file for complete search history.

(56) References Cited

U.S. PATENT DOCUMENTS

| 8,025,958 | B2 | 9/2011 | Yamamoto et al. |
| 8,929,085 | B2 | 1/2015 | Franklin et al. |
| 9,069,521 | B2 | 6/2015 | Lee et al. |

(Continued)

FOREIGN PATENT DOCUMENTS

| EP | 3118246 A1 | 1/2017 |
| EP | 3299162    | 3/2018 |

(Continued)

OTHER PUBLICATIONS

Partial European Search Report for Application No. 21178489.7-1216 dated Nov. 18, 2021.

*Primary Examiner* — Joe H Cheng
(74) *Attorney, Agent, or Firm* — CANTOR COLBURN LLP

(57) ABSTRACT

A display device includes a display panel and a window disposed on the display panel. The window includes a base layer including a first surface and a second surface opposite to each other, a first inorganic layer disposed on the first surface of the base layer, a second inorganic layer contacting the second surface of the base layer, and a protective layer disposed either between the base layer and the first inorganic layer, or on a first portion of the first inorganic layer which is opposite to a second portion of the first inorganic layer facing the base layer.

34 Claims, 12 Drawing Sheets

(56) References Cited

U.S. PATENT DOCUMENTS

| | | |
|---|---|---|
| 9,429,999 B2 | 8/2016 | Lee et al. |
| 9,688,051 B2 | 6/2017 | Min et al. |
| 10,234,693 B2 | 3/2019 | Lim et al. |
| 10,281,956 B2 | 5/2019 | Yang et al. |
| 2017/0106636 A1 | 4/2017 | Jo et al. |
| 2017/0156227 A1* | 6/2017 | Heo ..................... H05K 5/0017 |
| 2017/0179424 A1* | 6/2017 | Lee ........................ H10K 59/87 |
| 2018/0350892 A1* | 12/2018 | Nishinohara ....... H01L 27/3276 |
| 2019/0134946 A1* | 5/2019 | Choi ...................... H05B 33/28 |
| 2019/0143638 A1 | 5/2019 | Park et al. |
| 2019/0302499 A1 | 10/2019 | Yu |
| 2020/0028117 A1 | 1/2020 | Eckert et al. |
| 2020/0144545 A1* | 5/2020 | Cheng ................ H01L 51/5256 |
| 2020/0274105 A1* | 8/2020 | Han .................... H01L 51/0097 |
| 2020/0350512 A1* | 11/2020 | Guo .................... H01L 51/5253 |
| 2021/0041601 A1* | 2/2021 | Oh .......................... B32B 27/08 |
| 2022/0147170 A1* | 5/2022 | Park ........................ G06F 3/041 |
| 2022/0310971 A1* | 9/2022 | Lee ...................... H01L 27/323 |

FOREIGN PATENT DOCUMENTS

| | | |
|---|---|---|
| EP | 3633004 | 4/2020 |
| KR | 1020160115468 A | 10/2016 |
| KR | 1020170000031 A | 1/2017 |
| KR | 1020170043885 A | 4/2017 |
| KR | 1020170079506 A | 7/2017 |

\* cited by examiner

WINDOW AND DISPLAY DEVICE INCLUDING THE SAME

This application claims priority to Korean Patent Application No. 10-2020-0074368, filed on Jun. 18, 2020, and all the benefits accruing therefrom under 35 U.S.C. § 119, the content of which in its entirety is herein incorporated by reference.

BACKGROUND

1. Field

Embodiments of the invention herein relate to a window and a display device including the same, and more particularly, to a window and a display device having a flexible feature and improved impact resistance against external impacts.

2. Description of the Related Art

In recent years, foldable or bendable electronic devices are being actively developed. Such flexible electronic devices each include an electronic panel such as a flexible display panel or a flexible touch panel, and diverse outer members have different functions from one another. The outer members are disposed on at least any one of opposite surfaces of each of such electronic devices. The outer members may be deformable, e.g., rollable, bendable, or foldable, together with the electronic devices.

SUMMARY

Outer members are desired to have a relatively flexible property in order to be deformable, e.g., rollable, bendable or foldable. The flexible property may enhance reliability against stress caused by bending, but may reduce reliability against external impacts.

Embodiments of the invention provide a window having improved flexibility and improved impact resistance against external impacts.

Embodiments of the invention also provide a flexible display device capable of preventing damage to a display module due to external impacts while keeping flexibility.

An embodiment of the invention provides a display device including a display panel, and a window disposed on the display panel. The window includes a base layer having a first surface and a second surface opposite to each other, a first inorganic layer disposed on the first surface of the base layer, a second inorganic layer contacting the second surface of the base layer, and a protective layer disposed either between the base layer and the first inorganic layer, or on a first portion of the first inorganic layer which is opposite to a second portion of the first inorganic layer facing the base layer.

In an embodiment, the protective layer may be disposed between the base layer and the first inorganic layer, the first inorganic layer may include a plurality of layers, and the first inorganic layer may have a total thickness of about 10 nanometers (nm) or greater.

In an embodiment, the protective layer may be disposed between the base layer and the first inorganic layer, and further include a protective film disposed on the first portion of the first inorganic layer, and an adhesive layer bonding the first inorganic layer and the protective film.

In an embodiment, the protective layer may be disposed between the base layer and the first inorganic layer, and further include an anti-fingerprint layer disposed on the first portion of the first inorganic layer, and a primer layer increasing bonding strength between the anti-fingerprint layer and the first inorganic layer.

In an embodiment, the display device may further include a shock absorbing layer disposed on a first portion of the second inorganic layer which is opposite to a second portion of the second inorganic layer facing the base layer, and an adhesive layer bonding the second inorganic layer and the shock absorbing layer.

In an embodiment, the anti-fingerprint layer may be provided from a coating solution.

In an embodiment, the protective layer may be disposed on the first portion of the first inorganic layer.

In an embodiment, the display device may further include a primer layer increasing bonding strength between the protective layer and the first inorganic layer.

In an embodiment, the display device may further include a shock absorbing layer disposed on a first portion of the second inorganic layer which is opposite to a second portion of the second inorganic layer facing the base layer, and an adhesive layer bonding the second inorganic layer and the shock absorbing layer.

In an embodiment, the protective layer may include an organic material and an anti-fingerprint material which increase surface hardness.

In an embodiment, the first inorganic layer may have a thickness of about 50 nm to about 150 nm.

In an embodiment, the first inorganic layer may include a plurality of layers.

In an embodiment, the protective layer may be disposed on the first portion of the first inorganic layer and contact the first inorganic layer.

In an embodiment, the protective layer may include an inorganic material, and may further include an anti-fingerprint layer disposed on the protective layer, a primer layer increasing bonding strength between the anti-fingerprint layer and the protective layer, a shock absorbing layer disposed on a first portion of the second inorganic layer which is opposite to a second portion of the second inorganic layer facing the base layer, and an adhesive layer bonding the second inorganic layer and the shock absorbing layer.

In an embodiment, the first inorganic layer may have a thickness of about 50 nm to about 150 nm.

In an embodiment, the anti-fingerprint layer may be provided from a coating solution.

In an embodiment, the protective layer may include an organic material, and may further include an anti-fingerprint layer disposed on the protective layer, and a primer layer increasing bonding strength between the anti-fingerprint layer and the protective layer.

In an embodiment, the first inorganic layer may have a thickness of about 10 nm to about 25.

In an embodiment, the anti-fingerprint layer may include an anti-fingerprint material.

In an embodiment, the first inorganic layer may include a plurality of layers.

In an embodiment, the first inorganic layer and the second inorganic layer may include any one among silicon nitride, silicon oxy nitride, and silicon oxide.

In an embodiment, the display device may be folded with respect to a folding axis extending in one direction.

In an embodiment of the invention, a window includes a base layer having a first surface and a second surface opposite to each other, a first inorganic layer disposed on the first surface of the base layer, a second inorganic layer contacting the second surface of the base layer, and a protective layer disposed either between the base layer and the first inorganic layer or on a first portion of the first inorganic layer which is opposite to a second portion of the first inorganic layer facing the base layer.

In an embodiment, the protective layer may be disposed between the base layer and the first inorganic layer, the first inorganic layer may include a plurality of layers, and the first inorganic layer may have a total thickness of about 10 nm or greater.

In an embodiment, the protective layer may be disposed between the base layer and the first inorganic layer, and further include a protective film disposed on the first portion of the first inorganic layer, and an adhesive layer bonding the first inorganic layer and the protective film.

In an embodiment, the protective layer may be disposed between the base layer and the first inorganic layer, and further include an anti-fingerprint layer disposed on the first portion of the first inorganic layer, and a primer layer increasing bonding strength between the anti-fingerprint layer and the first inorganic layer.

In an embodiment, the window may further include a shock absorbing layer disposed on a first portion of the second inorganic layer which is opposite to a second portion of the second inorganic layer facing the base layer, and an adhesive layer bonding the second inorganic layer and the shock absorbing layer.

In an embodiment, the protective layer may be disposed on the first portion of the first inorganic layer, and further include a primer layer increasing bonding strength between the protective layer and the first inorganic layer, a shock absorbing layer disposed on a first portion of the second inorganic layer which is opposite to a second portion of the second inorganic layer facing the base layer, and an adhesive layer bonding the second inorganic layer and the shock absorbing layer.

In an embodiment, the protective layer may include an anti-fingerprint material.

In an embodiment, the protective layer may be disposed on the first portion of the first inorganic layer to contact the first inorganic layer.

In an embodiment, the protective layer may include an inorganic material, and further include an anti-fingerprint layer disposed on the protective layer, and a primer layer increasing bonding strength between the anti-fingerprint layer and the protective layer. The anti-fingerprint layer may be provided from a coating solution.

In an embodiment, the protective layer may include an organic material, and further include an anti-fingerprint layer disposed on the protective layer, and a primer layer increasing bonding strength between the anti-fingerprint layer and the protective layer, and the protective layer may include an anti-fingerprint material.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1:
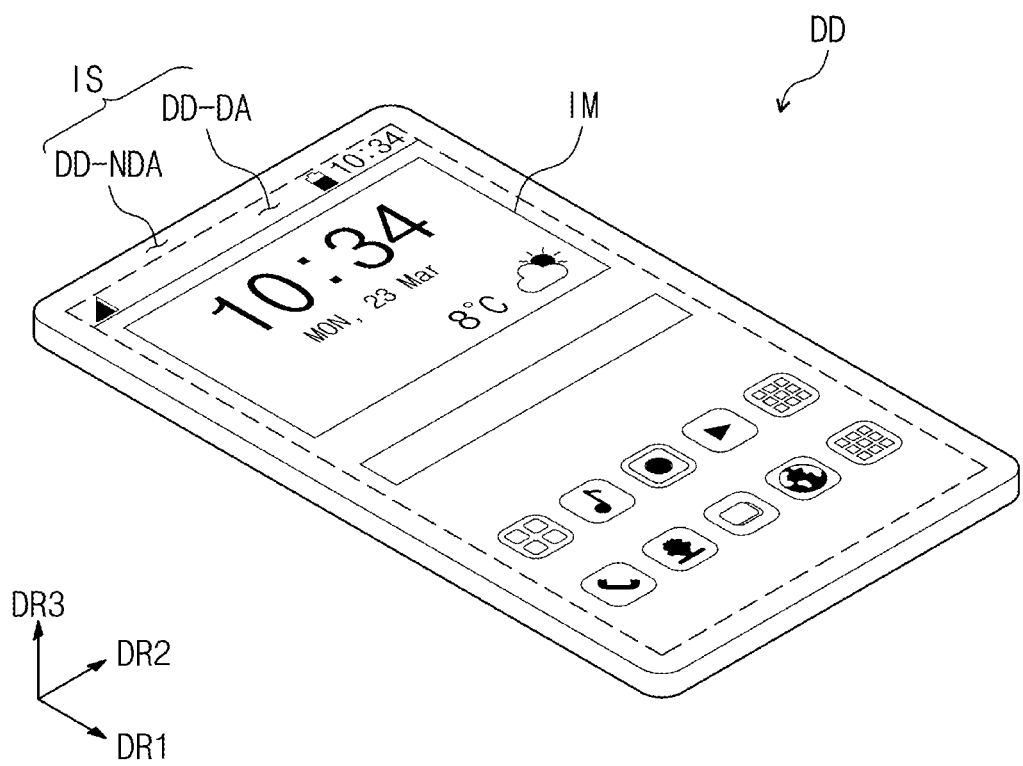
FIG. 1 is a perspective view of an embodiment of a display device according to the invention.

In the disclosure, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents.

The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of embodiments of the invention. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the invention pertains. It is also to be understood that terms defined in commonly used dictionaries should be interpreted as having meanings consistent with the meanings in the context of the related art, and are expressly defined herein unless they are interpreted in an ideal or overly formal sense.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

It should be understood that the terms "comprise", or "have" are intended to specify the presence of stated features, integers, steps, operations, elements, components, or combinations thereof in the disclosure, but do not preclude the presence or addition of one or more other features, integers, steps, operations, elements, components, or combinations thereof. Hereinafter, embodiments of the invention will be described with reference to the accompanying drawings.

Figure 2A:
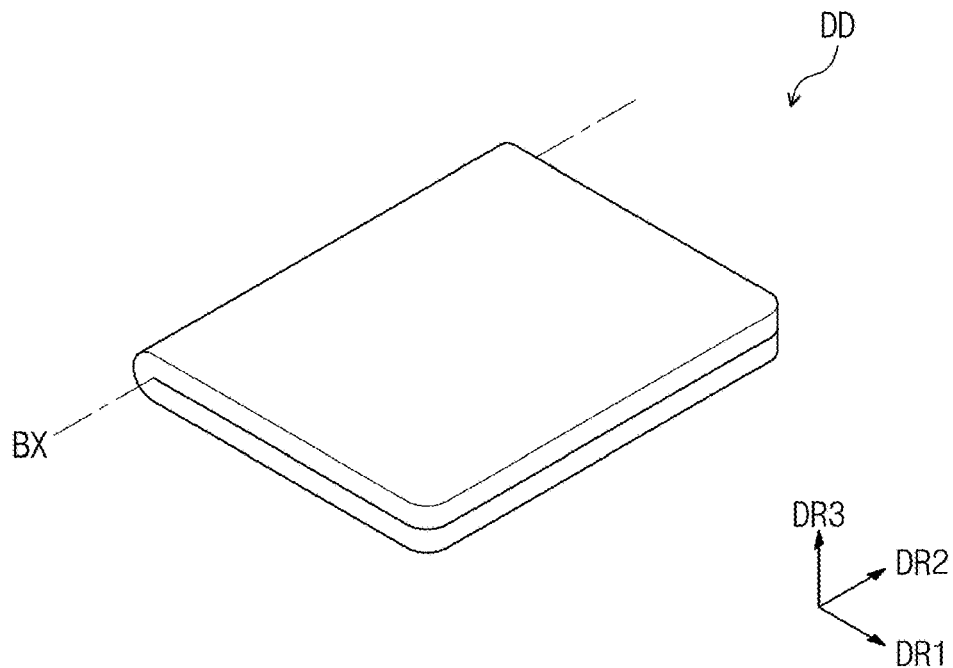
FIG. 2A is a perspective view illustrating an embodiment of a display device in a folded state according to the invention.
Figure 2B:
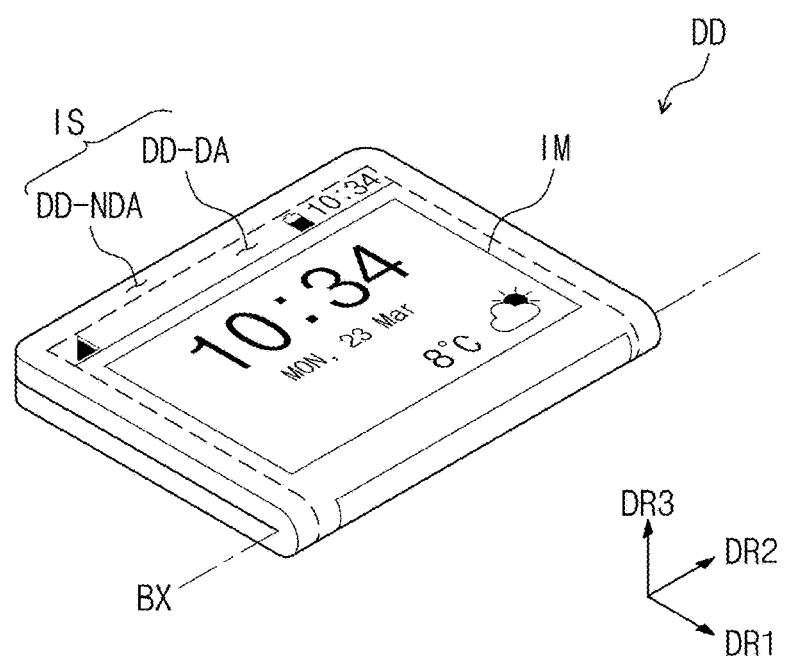
FIG. 2B is a perspective view illustrating an embodiment of a display device in an out-folded state according to the invention.
Figure 2C:
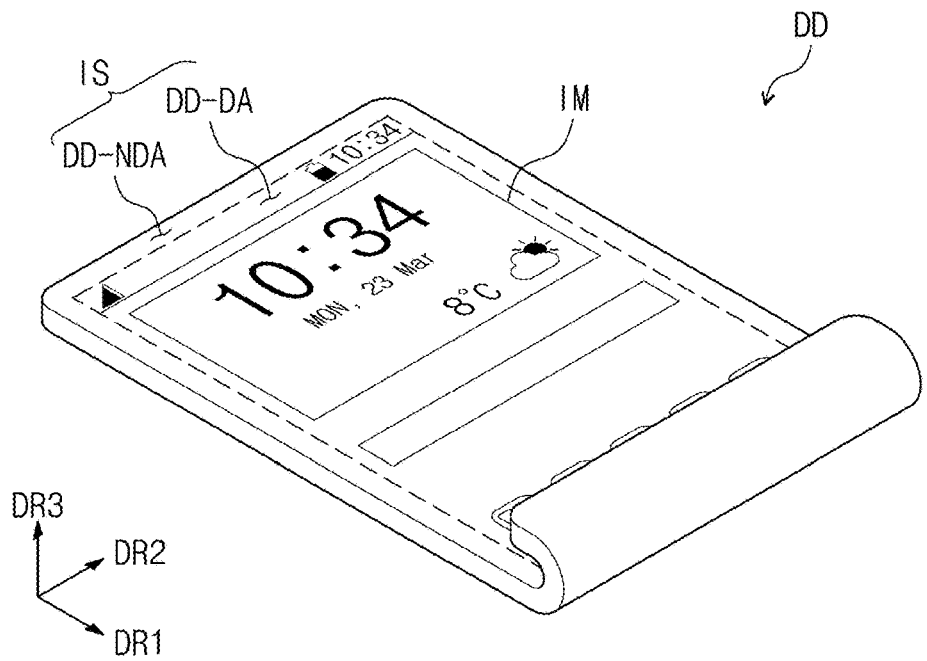
FIG. 2C is a perspective view illustrating an embodiment of a portion of a display device in a bent state according to the invention.
Figure 2D:
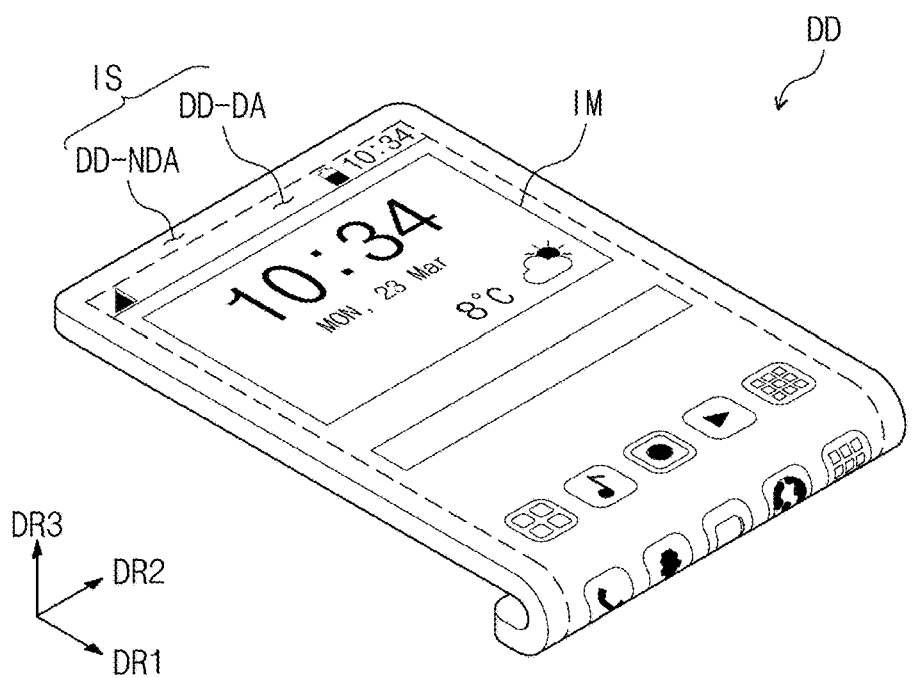
FIG. 2D is a perspective view illustrating an embodiment of a portion of a display device in a bent state according to the invention.
Figure 2E:
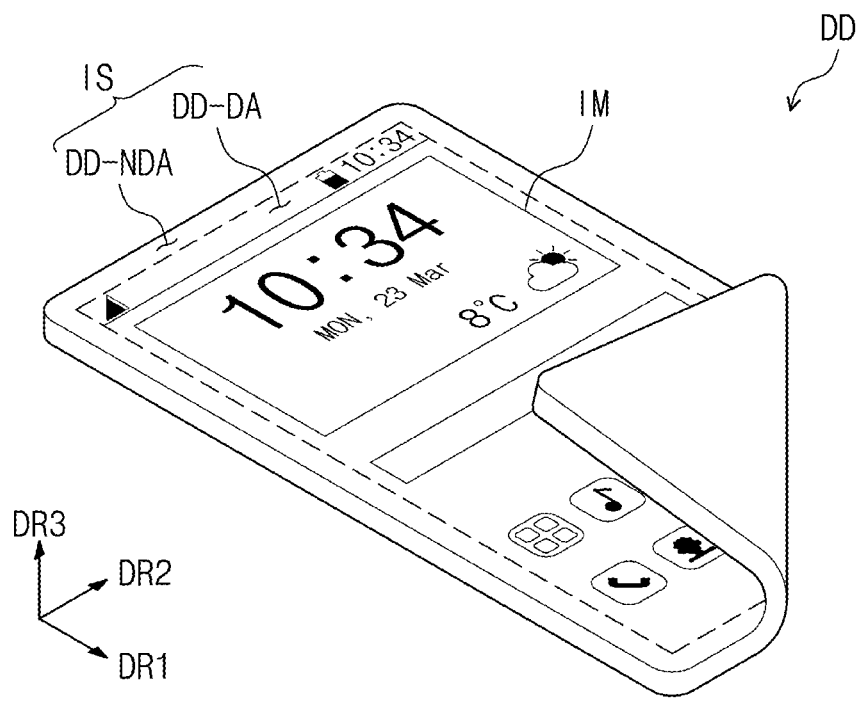
FIG. 2E is a perspective view illustrating an embodiment of a portion of a display device in a bent state according to the invention.

FIG. 1 is a perspective view of an embodiment of a display device according to the invention. FIG. 2A is a perspective view illustrating an embodiment of a display device in a folded state according to the invention. FIG. 2B is a perspective view illustrating an embodiment of a display device in an out-folded state according to the invention. FIG. 2C is a perspective view illustrating an embodiment of a portion of a display device in a bent state according to the invention. FIG. 2D is a perspective view illustrating an embodiment of a portion of a display device in a bent state according to the invention. FIG. 2E is a perspective view illustrating an embodiment of a portion of a display device in a bent state according to the invention.

Referring to FIG. 1, a display device DD of an embodiment of the invention includes a display surface IS displaying an image IM. The display surface IS displaying the image IM is parallel to a plane defined by a first direction DR1 and a second direction DR2. The normal direction of the display surface IS, that is, the thickness direction of the display device DD is indicated by a third direction DR3. An upper surface (or a front surface) and a rear surface (or a lower surface) of each member are separated by the third direction DR3. However, the directions indicated by the first to third direction DR1, DR2, and DR3 are relative concepts, and may thus be changed to other directions. Although a flexible display device is illustrated in the illustrated embodiment, the invention is not limited thereto. The display device DD in another embodiment may be a rigid display device.

The display device DD in an embodiment of the invention may be a deformable display device such as a foldable display device or a rollable display device. The display device DD in an embodiment of the invention may be not only used for large-sized display devices such as a television set and a monitor, but also used for small- and medium-sized display devices such as a mobile phone, a tablet, a car navigation unit, a game console, and a smartwatch.

The display surface IS of the display device DD in an embodiment of the invention may include a plurality of areas. The display device DD may include a display area DD-DA in which an image IM is displayed, and a non-display area DD-NDA adjacent to the display area DD-DA. The non-display area DD-NDA may be an area in which an image is not displayed. In FIG. 1, application icons and a clock window are presented as an example of an image IM. The display area DD-DA may have a quadrangular (e.g., rectangular) shape. The non-display area DD-NDA may surround the display area DD-DA. However, the invention is not limited thereto, and the forms of the display area DD-DA and the non-display area DD-NDA may be relatively altered.

Although not illustrated, the display device DD may include a housing. The housing is combined with a window WM to define the exterior of the display device DD, and components of the display device DD may be accommodated in an inner space defined by the housing and the window WM to be protected from external impacts. In addition, the housing may include a hinge according to a folding feature of the display device DD, and the invention is not limited to one embodiment.

Referring to FIG. 2A, the display device DD in an embodiment of the invention may be in-folded with respect to a folding axis BX. The virtual folding axis BX may be defined on the display surface IS to extend along the second direction DR2. When the display device DD in an embodiment of the invention is in-folded with respect to the folding axis BX, the display device is folded such that the display surface may face itself, and the rear surface opposite to the display surface IS may be exposed to the outside.

Referring to FIG. 2B, the display device DD in an embodiment of the invention may be out-folded with respect to the folding axis BX. The virtual folding axis BX may be defined on the rear surface of the display device DD to extend along the second direction DR2. When the display device DD in an embodiment of the invention is out-folded with respect to the folding axis BX, the display device is folded such that the rear surface may face itself, and the display surface IS may be exposed to the outside.

Referring to FIGS. 2C to 2E, the display device DD in an embodiment of the invention may be folded or rolled in various ways. As shown in FIG. 2C, the display device DD in an embodiment of the invention may be rolled or folded inwardly from an end portion. As shown in FIG. 2D, the display device DD in an embodiment of the invention may be rolled or folded outwardly from an end portion. As shown in 2E, the display device DD in an embodiment of the invention may be folded or rolled in a diagonal direction. However, the rolling or folding of the display device DD shown in FIGS. 2A to 2E is illustrated as an example, and the invention is not limited thereto, and the display device DD may be folded or rolled in various ways.

Figure 3A:
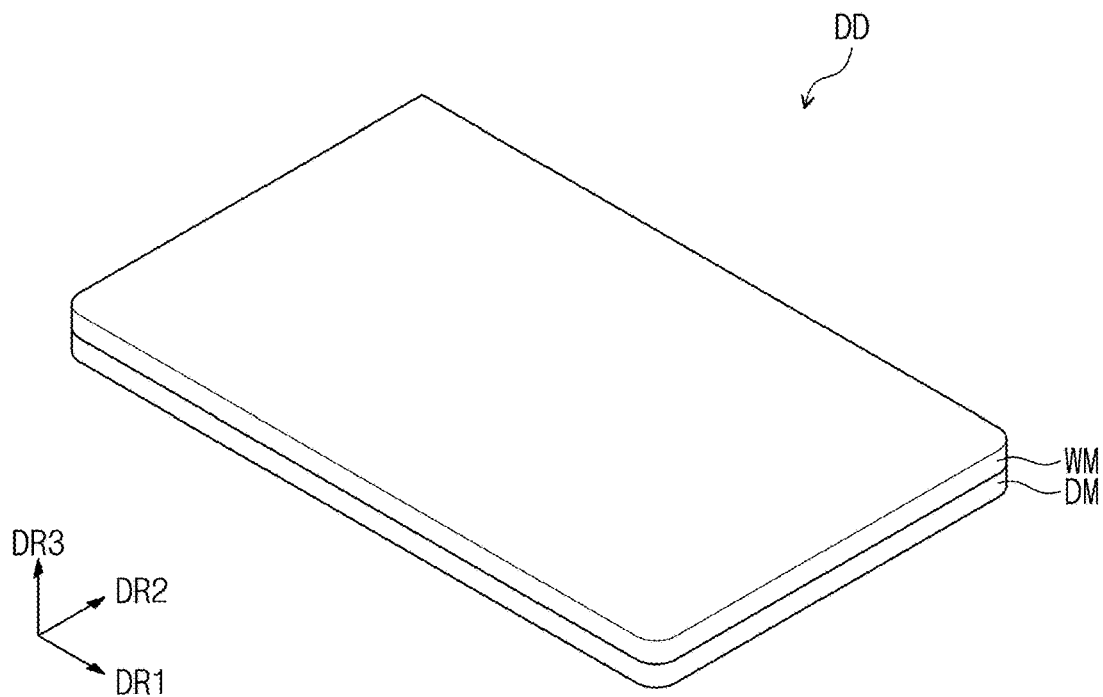
FIG. 3A is an assembled perspective view of an embodiment of a display device according to the invention.
Figure 3B:
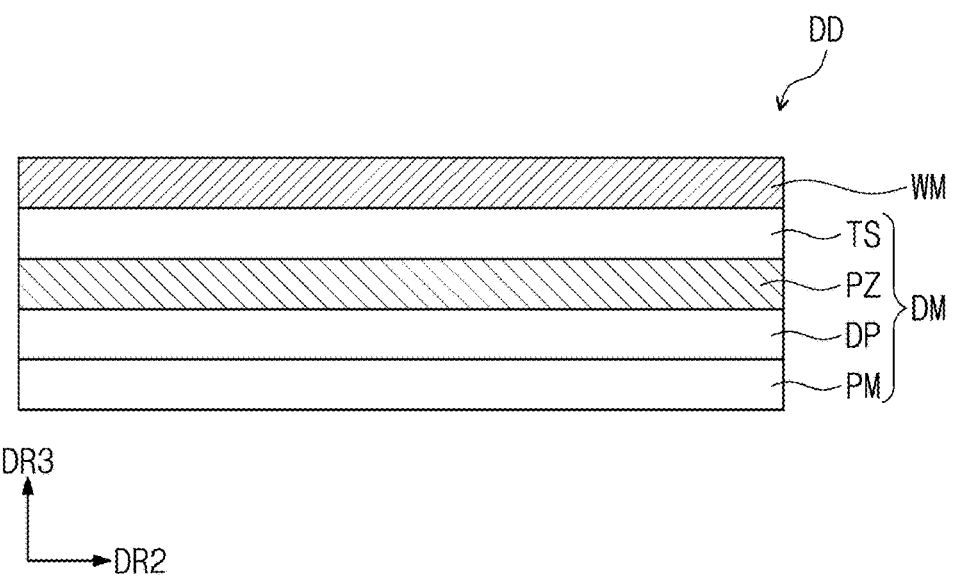
FIG. 3B is a cross-sectional view of an embodiment of a display device according to the invention.

FIG. 3A is a perspective view of an embodiment of a display device according to the invention. FIG. 3B is a cross-sectional view of an embodiment of a display device according to the invention. FIG. 3B illustrates cross sections defined by the second direction DR2 and the third direction DR3. Hereinafter, a display device DD in an embodiment of the invention will be described with reference to FIGS. 3A and 3B.

Referring to FIGS. 3A and 3B, the display device DD in an embodiment of the invention includes a display module DM and a window WM.

The display module DM may include a protective film PM, a display panel DP, an optical member PZ, and an input sensor TS. The display panel DP, the optical member PZ, and the input sensor TS may be sequentially stacked on the protective film PM.

The window WM may protect the display module DM from external impacts, and may provide a display surface to a user. The window WM may include an outer surface exposed to the outside. The display surface IS (refer to FIG. 1) of the display device DD may correspond to the outer surface of the window WM. A detailed description of the window WM will be described later.

The display module DM may include an upper surface and a rear surface opposite to the upper surface. The upper surface of the display module DM may be a display surface displaying an image. The display module DM may generate an image and display the image in a direction of the window WM contacting the upper surface of the display module DM.

The input sensor TS may sense an external input applied from the outside and generate an electrical signal. The input applied from the outside may be provided in diverse forms. In an embodiment, the external input may include an external input applied when approaching the display device DD or being adjacent by a predetermined distance (e.g., hovering), as well as contact by a part of a body such as a user's hand, for example. In addition, the external input may have a variety of forms such as force, pressure, and light, and is not limited to one embodiment. The input sensor TS according to the invention may sense an external input applied in a capacitive manner or a pressure sensing manner, and is not limited to one embodiment.

The optical member PZ optically converts incident light. The optical member PZ may reduce reflectance of light incident on a front surface, induce re-reflection of light incident on a rear surface, or improve transmittance of light incident on the rear surface. In an embodiment, the optical member PZ may include at least any one among a polarizing film, an antireflection film, a retardation film, and an anti-scattering film, for example.

FIG. 3B illustrates that the input sensor TS is disposed on the optical member PZ, and the optical member PZ is disposed on the display panel DP, but the invention is not limited thereto, and arrangement of each component may change. In an embodiment, the input sensor TS may be disposed on the display panel DP, for example. In this case, the input sensor TS may be directly disposed on the display panel DP through a continuous process along with the display panel DP, and the input sensor TS is provided in a separate panel form to combine with the display panel DP through an adhesive layer, and the invention is not limited to one embodiment.

In addition, the optical member PZ may be disposed on the input sensor TS. The input sensor TS may be integrated on the display panel DP through a continuous process. In this case, the input sensor TS may be also referred to as an input sensing unit or an input sensing circuit.

The display panel DP may include a plurality of pixels and generate the image IM (refer to FIG. 1) corresponding to the input image data. The display panel DP may generate an image and display the image in the thickness direction DR3 of the display device DD. The display panel DP may display the generated image in an upper direction in which the window WM is disposed.

The protective film PM may be disposed on under the display panel DP to protect the display panel DP. To be more specific, the protective film PM may prevent external moisture from penetrating into the display panel DP and absorb external shocks. The protective film PM may include a plastic film as a base layer. In an embodiment, the protective film PM may include a plastic film including one of polyethersulfone ("PES"), polyacrylate, polyetherimide ("PEI"), polyethylene naphthalate ("PEN"), polyethylene terephthalate ("PET"), phenylene sulfide ("PPS"), polyarylate, polyimide ("PI"), polycarbonate ("PC"), poly(arylene ethersulfone), and any combinations thereof.

Materials constituting the protective film PM are not limited to plastic resins, and may include an organic/inorganic composite material. The protective film PM may include a porous organic layer and an inorganic material filled in the pores of the organic layer. The protective film PM may further include a film-functional layer disposed on a plastic film. The film-functional layer may include a resin layer. The film-functional layer may be provided through a coating method.

Figure 4A:
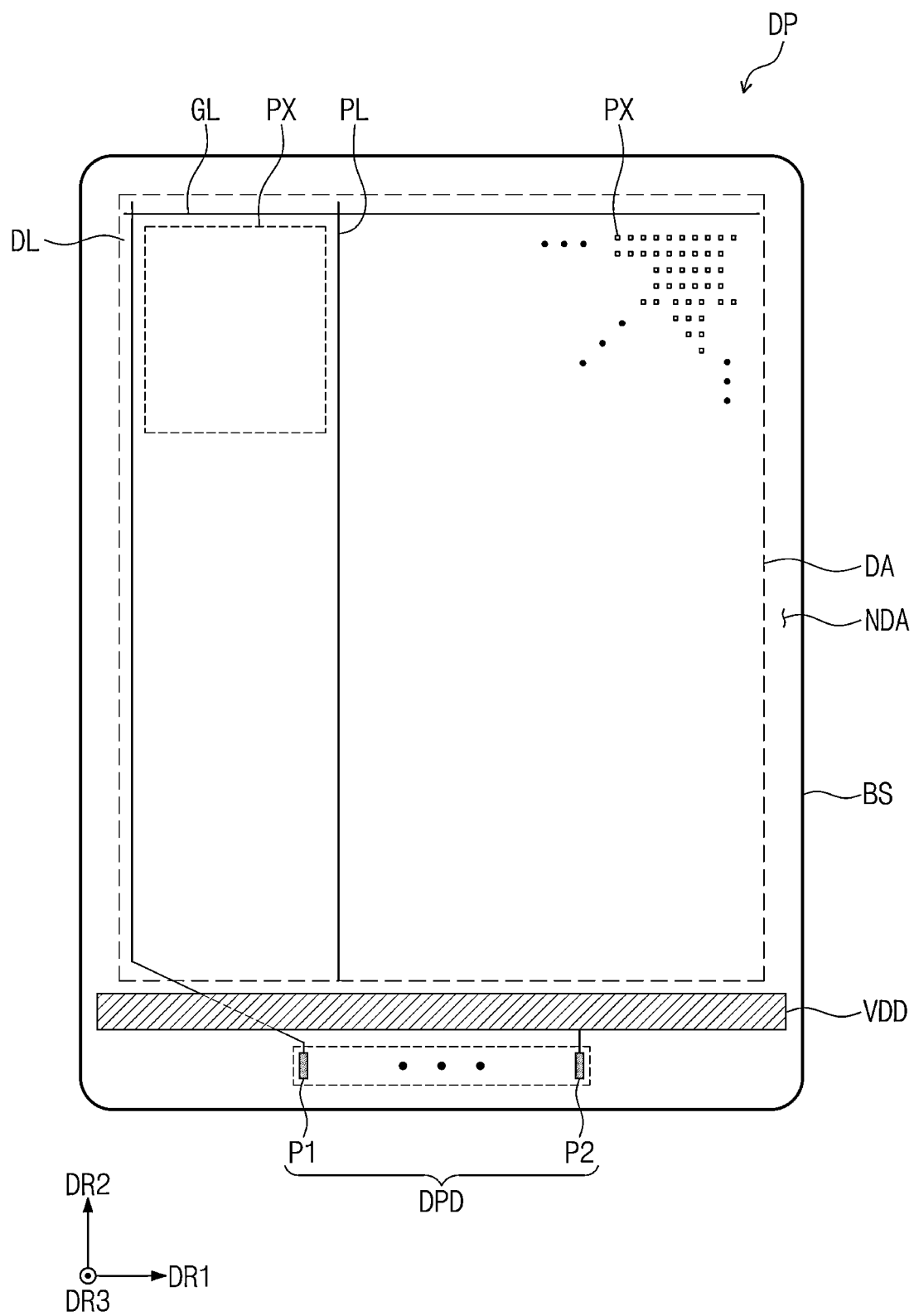
FIG. 4A is a plan view of an embodiment of a display panel according to the invention.
Figure 4B:
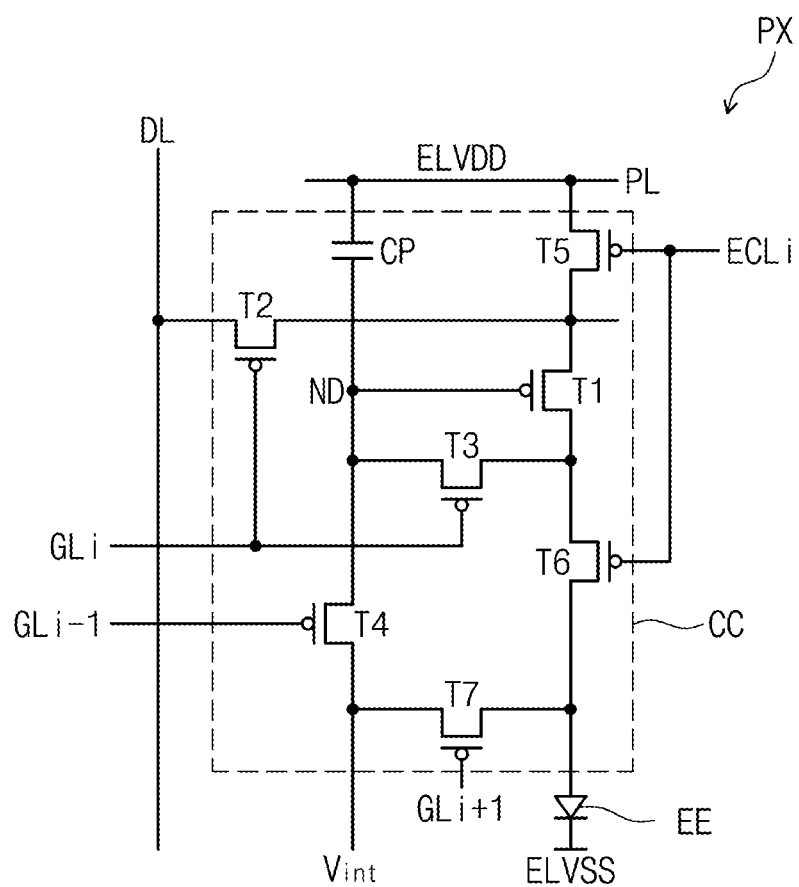
FIG. 4B is an equivalent circuit view of an embodiment of a pixel according to the invention.

FIG. 4A is a plan view of an embodiment of a display panel according to the invention. FIG. 4B is an equivalent circuit view of an embodiment of a pixel according to the invention.

As illustrated in FIG. 4A, the display panel DP includes a display area DA and a non-display area NDA in a plan view. The display area DA and the non-display area NDA of the display panel DP correspond to a display area DD-DA (refer to FIG. 1) and a non-display area DD-NDA (refer to FIG. 1) of the display device DD (refer to FIG. 1), respectively. The display area DA and the non-display area NDA of the display panel DP are not necessarily identical to the display area DD-DA (refer to FIG. 1) and the non-display area DD-NDA of the display device DD (refer to FIG. 1A), and may change according to the structure/design of the display panel DP.

Referring to FIG. 4A, the display panel DP in an embodiment of the invention includes a base substrate BS, a plurality of pixels PX, a plurality of signal lines GL, DL, and PL, and a plurality of display pads DPD. The display area DA and the non-display area NDA may be areas provided by the base substrate BS. The base substrate BS may include an insulating substrate. In an embodiment, the base substrate BS may include a glass substrate, a plastic substrate, or any combinations thereof, for example.

The signal lines GL, DL, and PL are connected to the pixels PX to transmit electrical signals to the pixels PX. FIG. 4A illustrates, as an example, a scan line GL, a data line DL, and a power line PL among signal lines included in the display panel DP. However, this is illustrated as an example, and the signal lines GL, DL, and PL may further include at least any one among a power line, an initialization voltage line, and a light emission control line, and the invention is not limited to one embodiment.

FIG. 4B illustrates, as an example, an enlarged signal circuit view of one pixel PX among a plurality of pixels. FIG. 4B illustrates, as an example, a pixel PX connected to a i-th scan line GLi and a i-th light emission control line ECLi where i is a natural number greater than one.

The pixel PX may include a light emitting element EE and a pixel circuit CC. The pixel circuit CC may include a plurality of transistors T1 to T7 and a capacitor CP. In an embodiment, the plurality of transistors T1 to T7 may be provided through a low temperature polycrystalline silicon ("LTPS") process or a low temperature polycrystalline oxide ("LTPO") process, for example.

The pixel circuit CC controls the amount of current flowing through the light emitting element EE in response to data signals. The light emitting element EE may emit light with a predetermined luminance in response to the amount of current provided from the pixel circuit CC. To this end, the level of a first power ELVDD may be set higher than the level of a second power ELVSS. The light emitting element EE may include an organic light emitting element or a quantum dot light emitting element.

The plurality of transistors T1 to T7 each may include an input electrode (or a source electrode), an output electrode (or a drain electrode), and a control electrode (or a gate electrode). In the description, for convenience, any one of the input electrode or the output electrode may be also referred to as a first electrode, and the other may be also referred to as a second electrode.

The first electrode of the first transistor T1 is connected to the first power ELVDD via the fifth transistor T5, and the second electrode of the first transistor T1 is connected to an anode electrode of the light emitting element EE via the sixth transistor T6. The first transistor T1 may be also referred to as a driving transistor in the description.

The first transistor T1 controls the amount of current flowing through the light emitting element EE in response to a voltage applied to the control electrode of the first transistor T1.

The second transistor T2 is connected between the data line DL and the first electrode of the first transistor T1. In addition, the control electrode of the second transistor T2 is connected to the i-th scan line GLi. The second transistor T2 is turned on when an i-th scan signal is provided to the i-th scan line GLi to electrically connect the data line DL with the first electrode of the first transistor T1.

The third transistor T3 is connected between the second electrode of the first transistor T1 and the control electrode of the first transistor T1. The control electrode of the third transistor T3 is connected to the i-th scan line GLi. The third transistor T3 is turned on when an i-th scan signal is provided to the i-th scan line GLi to electrically connect the second electrode of the first transistor T1 with the control electrode of the first transistor T1. Accordingly, when the third transistor T3 is turned on, the first transistor T1 is connected in the form of a diode.

The fourth transistor T4 is connected between a node ND and an initialization power generation unit (not shown). In addition, the control electrode of the fourth transistor T4 is connected to an i−1th scan line GLi−1. The fourth transistor T4 is turned on when an i−1th scan signal is provided to the i−1th scan line GLi−1 to provide an initialization voltage Vint to the node ND.

The fifth transistor T5 is connected between the power line PL and the first electrode of the first transistor T1. The control electrode of the fifth transistor T5 is connected to the i-th light emitting control line ECLi.

The sixth transistor T6 is connected between the second electrode of the first transistor T1 and the anode electrode of the light emitting element EE. In addition, the control electrode of the sixth transistor T6 is connected to the i-th light emitting control line ECLi.

The seventh transistor T7 is connected between the initialization power generation unit (not shown) and the anode electrode of the light emitting element EE. In addition, the control electrode of the seventh transistor T7 is connected to an i+1th scan line GLi+1. Such a seventh transistor T7 is turned on when an i+1th scan signal is provided to the i+1th scan line GLi+1 to provide the initialization voltage Vint to the anode electrode of the light emitting element EE.

The seventh transistor T7 may improve black-displaying capability of the pixel PX. Specifically, when the seventh transistor T7 is turned on, a parasitic capacitor (not shown) of the light emitting element EE is discharged. Then, when black luminance is implemented, the light emitting element EE does not emit light due to a leakage current from the first transistor T1, and accordingly, the black-displaying capability may be improved.

Additionally, FIG. 4B illustrates that the control electrode of the seventh transistor T7 is connected to the i+1th scan line GLi+1, but the invention is not limited thereto. In another embodiment of the invention, the control electrode of the seventh transistor T7 may be connected to the i-th scan line GLi or the i−1th scan line GLi−1.

The capacitor CP is disposed between the power line PL and the node ND. The capacitor CP stores a voltage corresponding to a data signal. The amount of current flowing through the first transistor T1 may be determined when the fifth transistor T5 and the sixth transistor T6 are turned on according to the voltage stored in the capacitor CP.

In the invention, an equivalent circuit of the pixel PX is not limited to the equivalent circuit shown in FIG. 4B. In another embodiment of the invention, the pixel PX may be implemented in various forms to emit light of the light emitting element EE. In FIG. 4B, the pixel circuit CC is illustrated to only include p-channel (+) metal-oxide-semiconductor ("PMOS") transistors, but the invention is not limited thereto. In another embodiment of the invention, the pixel circuit CC may only include n-channel (−) metal-oxide-semiconductor ("NMOS") transistors. In another embodiment of the invention, the pixel circuit CC may include a combination of NMOS and PMOS transistors.

A light emitting pixel may have the same configuration as the pixel PX described above. That is, the light emitting pixel may include the light emitting element EE and the pixel circuit CC.

A non-light emitting pixel may be defined without any one of components included in the light emitting element EE and the pixel circuit CC. In an embodiment, in the non-light emitting pixel, any one of the electrodes included in the light emitting element EE out of the configuration of the pixel PX may be omitted, or any one of the transistors T1 to T7 may be omitted, for example. Accordingly, the non-light emitting pixel may be defined with a configuration in which light is not substantially generated.

Referring back to FIG. 4A, a power pattern VDD is disposed in the non-display area NDA. In the illustrated embodiment, the power pattern VDD is connected to a plurality of power lines PL. Accordingly, the display panel DP includes the power pattern VDD, and may thus provide identical first power signals to the plurality of pixels PX.

The display pads DPD may include a first pad P1 and a second pad P2. The first pads P1 may be provided in plural and may be respectively connected to the data lines DL. The second pad P2 may be connected to the power pattern VDD to be electrically connected to the power line PL. The display panel DP may provide electrical signals provided from the outside through the display pads DPD to the pixels PX. The display pads DPD may further include pads for receiving other electrical signals in addition to the first pad P1 and the second pad P2, and the invention is not limited to one embodiment.

Figure 5:
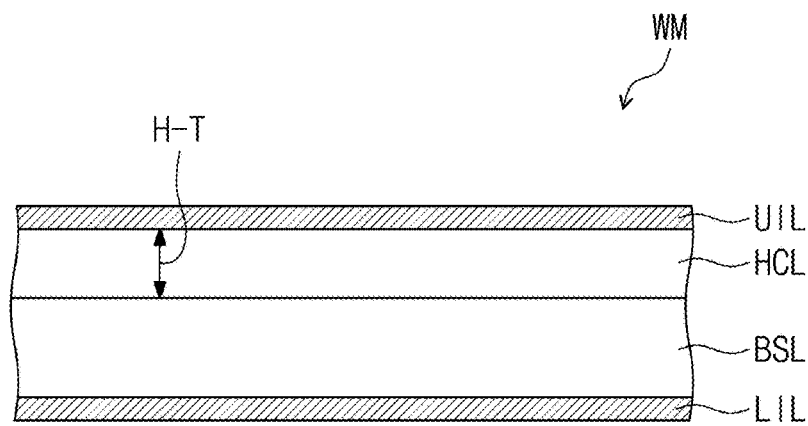
FIG. 5 is a cross-sectional view of an embodiment of a window according to the invention.
Figure 5:
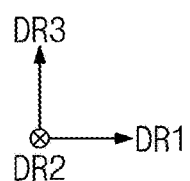

FIG. 5 is a cross-sectional view of an embodiment of a window according to the invention. Hereinafter, embodiments of windows to be described with reference to FIGS. 6 to 9 may correspond to a configuration to be described in FIG. 5, and duplicate descriptions will be omitted.

In the illustrated embodiment, the window WM includes a base layer BSL, a protective layer HCL, a first inorganic layer UIL, and a second inorganic layer LIL.

The base layer BSL may include a transparent polymer material. In an embodiment, the base layer BSL may include polyimide, polyacrylate, polymethylmethacrylate ("PMMA"), polycarbonate ("PC"), polyethylene naphthalate ("PEN"), polyvinylidene chloride, polyvinylidene difluoride ("PVDF"), polystyrene, ethylene-vinyl alcohol copolymer, or any combinations thereof, for example. Preferably, the base layer BSL includes polyimide, and may thus increase transparency, strength, and surface hardness.

In the illustrated embodiment, the protective layer HCL is disposed on the base layer BSL. The protective layer HCL may be disposed between the upper surface of the base layer BSL and the first inorganic layer UIL. The protective layer HCL is a layer having a function of increasing the surface hardness of the window WM.

The protective layer HCL may include any one among an organic compound, an inorganic compound, and an organic-inorganic composite compound. In an embodiment, the protective layer HCL may include an acrylic-based compound, an epoxy-based compound, or any combinations thereof, for example. In an alternative embodiment, the protective layer HCL may include any one inorganic compound among silicon nitride, silicon oxynitride, silicon oxide, zirconium oxide, aluminum oxide, tantalum oxide, niobium oxide, and glass beads.

The protective layer HCL may be provided through a wet coating method. The protective layer HCL may be provided by applying any one of an organic compound coating solution or an organic-inorganic compound coating solution onto the base layer BSL, and then curing the coating solution.

When the protective layer HCL includes an inorganic compound coating solution, the protective layer HCL may be provided through a process of depositing an inorganic compound coating solution on the base layer BSL. In the illustrated embodiment, when the protective layer HCL includes an inorganic compound, the thickness H-T of the protective layer HCL along the third direction DR3 may be about 500 nanometers (nm) to about 1 micrometers (µm). When the protective layer HCL includes an organic compound, the thickness H-T of the protective layer HCL along the third direction DR3 may be about 3 µm to about 10 µm.

Although not shown, the protective layer HCL may be provided as a plurality of layers each including any one among an organic compound, an inorganic compound, and an organic-inorganic composite compound. In addition, the protective layer HCL may be disposed between the rear surface of the base layer BSL and the second inorganic layer LIL, but is not limited to one embodiment.

The first inorganic layer UIL is disposed on the upper surface of the base layer BSL. In the illustrated embodiment, the first inorganic layer UIL is disposed on the protective layer HCL, and is disposed to be spaced apart from the base layer BSL with the protective layer HCL therebetween. The second inorganic layer LIL may be disposed under the base layer BSL to contact the rear surface of the base layer BSL.

The first inorganic layer UIL and the second inorganic layer LIL may include an inorganic compound. In an embodiment, the first inorganic layer UIL and the second inorganic layer LIL may include any one among silicon nitride, silicon oxy nitride, silicon oxide, zirconium oxide, and aluminum oxide, for example. A method for forming the inorganic layers UIL and LIL may be deposition through a sputtering process, but is not limited to one embodiment.

The window WM according to the invention includes the first inorganic layer UIL and the second inorganic layer LIL covering the base layer BSL and the protective layer HCL, and may thus enhance a function of preventing moisture transmission, and steadily maintain physical properties such as modulus and yield point under high temperature/high humidity conditions. In addition, the inclusion of the first inorganic layer UIL and the second inorganic layer LIL may improve surface hardness and pressing characteristics such as pen pressing and pen drop, and according to the display device DD including a folding feature, the crease of the window WM overlapping a folded area may be reduced.

Figure 6:
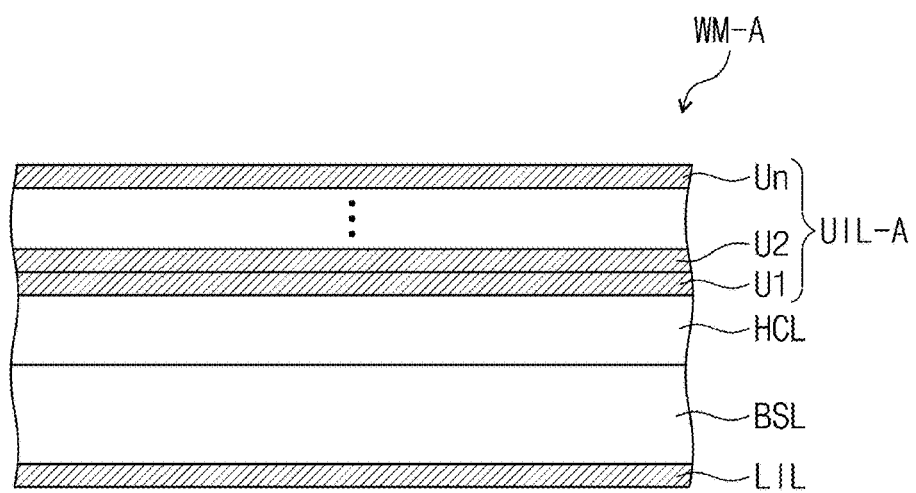
FIG. 6 is a cross-sectional view of an embodiment of a window according to the invention.
Figure 6:
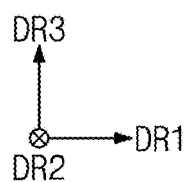

FIG. 6 is a cross-sectional view of an embodiment of a window according to the invention. The same/similar reference numerals are applied to the same/similar configurations as those described in FIG. 5, and duplicate descriptions are omitted.

Referring to FIG. 6, a window WM-A includes a base layer BSL, a protective layer HCL, a first inorganic layer UIL-A, and a second inorganic layer LIL.

The protective layer HCL is disposed on an upper surface of the base layer BSL. A first inorganic layer UIL-A is disposed on the protective layer HCL. The second inorganic layer LIL may be disposed under the base layer BSL to contact the rear surface of the base layer BSL.

In the illustrated embodiment, the first inorganic layer UIL-A may include a plurality of layers U1, U2 . . . Un, where n is a natural number greater than two. The total thickness of the first inorganic layer UIL-A, that is, the sum of the thicknesses of the plurality of layers U1, U2 . . . Un in the third direction DR3 may be about 10 nm or greater. Each of the plurality of layers U1, U2 . . . Un may include an inorganic compound. In an embodiment, each of the plurality of layers U1, U2 . . . Un may include any one among silicon nitride, silicon oxynitride, silicon oxide, zirconium oxide, and aluminum oxide, for example. In the illustrated embodiment, the first inorganic layer UIL-A disposed on the outermost side is stacked in the third direction DR3 and includes a plurality of layers U1, U2 . . . Un, which include an inorganic material, and may thus enhance a function of preventing moisture transmission.

Figure 7:
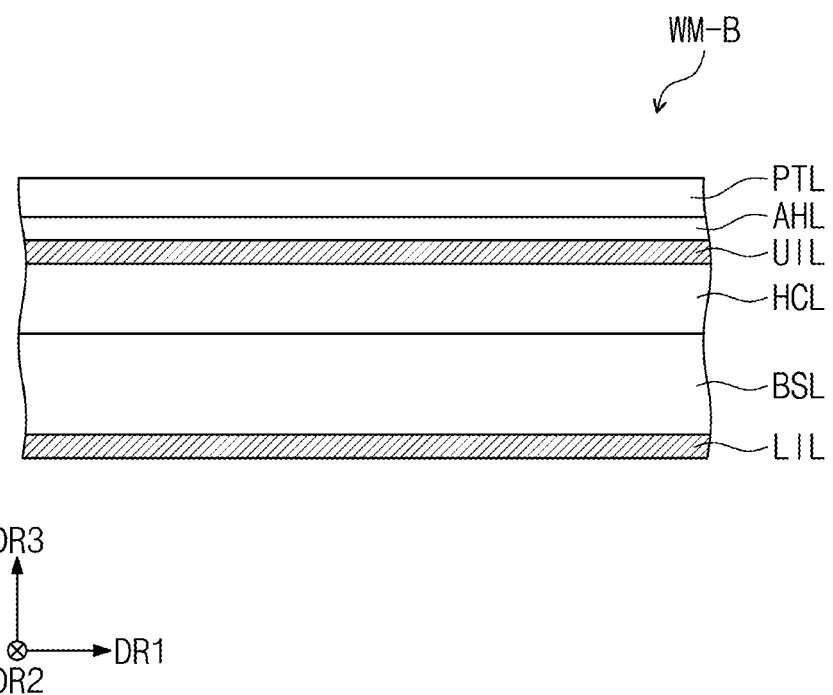
FIG. 7 is a cross-sectional view of an embodiment of a window according to the invention.

FIG. 7 is a cross-sectional view of an embodiment of a window according to the invention. The same/similar reference numerals are applied to the same/similar configurations as those described in FIG. 5, and duplicate descriptions are omitted.

Referring to FIG. 7, a window WM-B includes a base layer BSL, a protective layer HCL, a first inorganic layer UIL, and a second inorganic layer LIL. In addition, in the illustrated embodiment, the window WM-B may further include a protective film PTL and an adhesive layer AHL.

The protective layer HCL is disposed on an upper surface of the base layer BSL. A first inorganic layer UIL is disposed on the protective layer HCL. The second inorganic layer LIL may be disposed under the base layer BSL to contact the rear surface of the base layer BSL.

In the illustrated embodiment, the protective film PTL may be disposed on an upper portion of the first inorganic layer UIL. The adhesive layer AHL may be disposed between the first inorganic layer UIL and the protective film PTL to bond the first inorganic layer UIL and the protective film PTL.

The protective film PTL may be provided in a form in which a base layer including PET is mixed with the same material as that of the protective layer HCL and an anti-fingerprint material. In an embodiment, the anti-fingerprint material may include at least any one among a metal oxide such as titanium oxide, a silicon-based compound, and a fluorine-based compound, for example, but the anti-fingerprint material is not limited thereto as long as it is a conventional material known to those skilled in the art.

The adhesive layer AHL may be a pressure sensitive adhesive ("PSA"), an optical clear adhesive ("OCA"), or an optical clear resin ("OCR"). In addition, the adhesive layer AHL may include a photocurable adhesive material or a thermosetting adhesive material, and the material is not limited thereto.

In the illustrated embodiment, the bonding strength between the first inorganic layer UIL and the adhesive layer AHL may be weaker than the bonding strength between the protective film PTL and the adhesive layer AHL. Accordingly, the protective film PTL provided in the form of a film may be detached/attached from the first inorganic layer UIL and replaced.

Figure 8A:
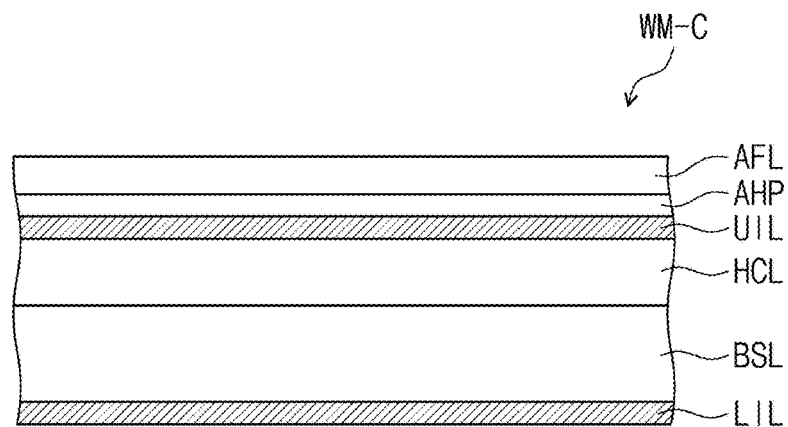
FIG. 8A is a cross-sectional view of an embodiment of a window according to the invention.
Figure 8A:
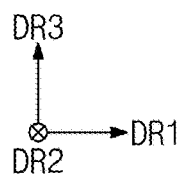
Figure 8B:
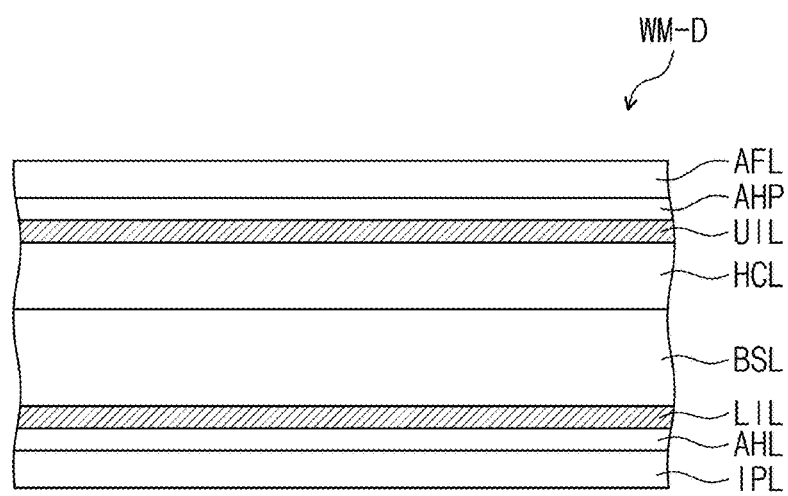
FIG. 8B is a cross-sectional view of an embodiment of a window according to the invention.
Figure 8B:
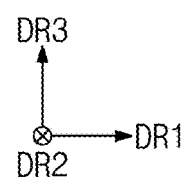

FIG. 8A is a cross-sectional view of an embodiment of a window according to the invention. FIG. 8B is a cross-sectional view of an embodiment of a window according to the invention. The same/similar reference numerals are applied to the same/similar configurations as those described in FIG. 5, and duplicate descriptions are omitted.

Referring to FIG. 8A, a window WM-C includes a base layer BSL, a protective layer HCL, a first inorganic layer UIL, and a second inorganic layer LIL. In addition, in the illustrated embodiment, the window WM-C may further include an anti-fingerprint layer AFL and a primer layer AHP.

The protective layer HCL is disposed on an upper surface of the base layer BSL. A first inorganic layer UIL is disposed on the protective layer HCL. The second inorganic layer LIL may be disposed under the base layer BSL to contact the rear surface of the base layer BSL.

In the illustrated embodiment, the anti-fingerprint layer AFL may be disposed on an upper portion of the first inorganic layer UIL. The primer layer AHP is disposed between the first inorganic layer UIL and the anti-fingerprint layer AFL, and may thus increase bonding strength between the first inorganic layer UIL and the anti-fingerprint layer AFL.

Unlike the protective film PTL described in FIG. 7, the anti-fingerprint layer AFL according to the invention may be provided by being coated on the first inorganic layer UIL. The anti-fingerprint layer AFL may be provided by applying a solution including an anti-fingerprint material. The coating method may be wet coating or dry coating, and is not limited to thereto.

The primer layer AHP may be an auxiliary adhesive layer for increasing bonding strength between the anti-fingerprint layer AFL and the first inorganic layer UIL. In an embodiment, the primer layer AHP may include a silane-based coupling agent and an isocyanate.

Referring to FIG. 8B, a window WM-D may include a base layer BSL, a protective layer HCL, a first inorganic layer UIL, a second inorganic layer LIL, an anti-fingerprint layer AFL, and a primer layer AHP. In addition, in the illustrated embodiment, the window WM-D may further include a shock absorbing layer IPL and an adhesive layer AHL.

The base layer BSL, the protective layer HCL, the first inorganic layer UIL, the second inorganic layer LIL, the anti-fingerprint layer AFL, and the primer layer AHP of the window WM-D may correspond to the base layer BSL, the protective layer HCL, the first inorganic layer UIL, the second inorganic layer LIL, the anti-fingerprint layer AFL, and the primer layer AHP, respectively.

In the illustrated embodiment, the shock absorbing layer IPL is disposed on the rear surface of the base layer BSL. The shock absorbing layer IPL may be spaced apart from the base layer BSL with the second inorganic layer LIL therebetween.

In an embodiment, the shock absorbing layer IPL may include any one among PET, polyurethane, for example, a thermoplastic polyurethane elastomer ("TPU"), a silicone-based polymer, and rubber. The shock absorbing layer IPL may serve as a stress buffer for alleviating impacts applied to the base layer BSL.

The adhesive layer AHL may be disposed between the second inorganic layer LIL and the shock absorbing layer IPL to bond the second inorganic layer LIL and the shock absorbing layer IPL.

In an embodiment, the adhesive layer AHL may be a PSA, an OCA, or OCR, for example In addition, the adhesive layer AHL may include a photocurable adhesive material or a thermosetting adhesive material, and the material is not limited thereto.

Figure 9:
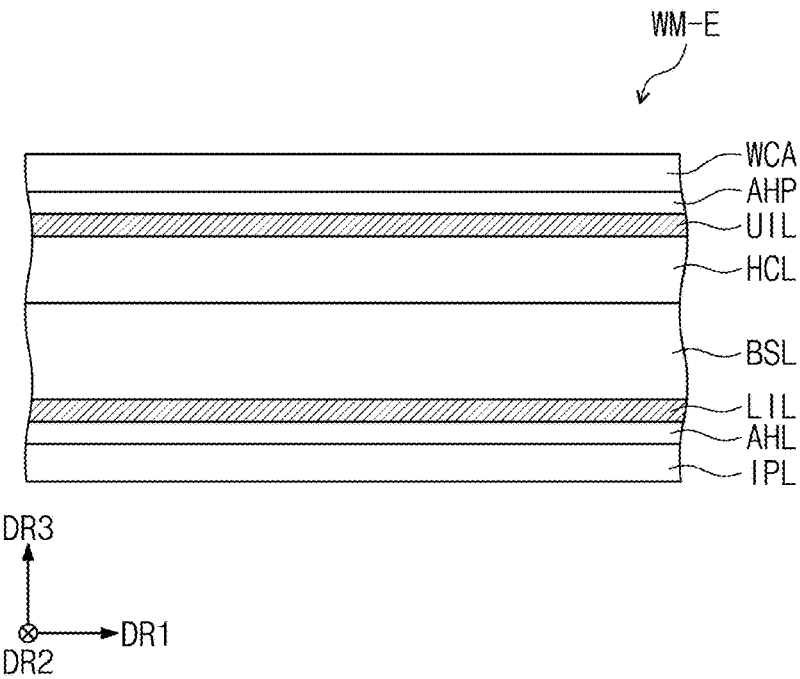
FIG. 9 is a cross-sectional view of an embodiment of a window according to the invention.

FIG. 9 is a cross-sectional view of an embodiment of a window according to the invention. The same/similar reference numerals are applied to the same/similar configurations as those described in FIG. 5, and duplicate descriptions are omitted.

Referring to FIG. 9, a window WM-E includes a base layer BSL, a protective layer HCL, a first inorganic layer UIL, and a second inorganic layer LIL. In addition, in the illustrated embodiment, the window WM-E may further include an anti-fingerprint layer WCA and a primer layer AHP.

The protective layer HCL is disposed on an upper surface of the base layer BSL. The first inorganic layer UIL is disposed on the protective layer HCL. The second inorganic layer LIL may be disposed under the base layer BSL to contact the rear surface of the base layer BSL.

In the illustrated embodiment, the anti-fingerprint layer WCA may be disposed on an upper portion of the first inorganic layer UIL. The primer layer AHP is disposed between the first inorganic layer UIL and the anti-fingerprint layer WCA to increase bonding strength between the first inorganic layer UIL and the anti-fingerprint layer WCA.

The anti-fingerprint layer WCA of the invention may be provided by applying a solution including an anti-fingerprint material. The coating method may be, as an embodiment of wet coating, spray coating applicable to forming anti-fingerprint layer WCA on the primer layer AHP. When the anti-fingerprint layer WCA is provided through a wet coating method, the protective layer HCL of the illustrated embodiment may include an inorganic compound.

The primer layer AHP may be an auxiliary adhesive layer for increasing bonding strength between the anti-fingerprint layer WCA and the first inorganic layer UIL. In an embodiment, the primer layer AHP may include a silane-based coupling agent and an isocyanate.

The shock absorbing layer IPL is disposed on the rear surface of the base layer BSL. The shock absorbing layer IPL may be spaced apart from the base layer BSL with the second inorganic layer LIL therebetween.

The adhesive layer AHL may be disposed between the second inorganic layer LIL and the shock absorbing layer IPL to bond the second inorganic layer LIL and the shock absorbing layer IPL.

Figure 10:
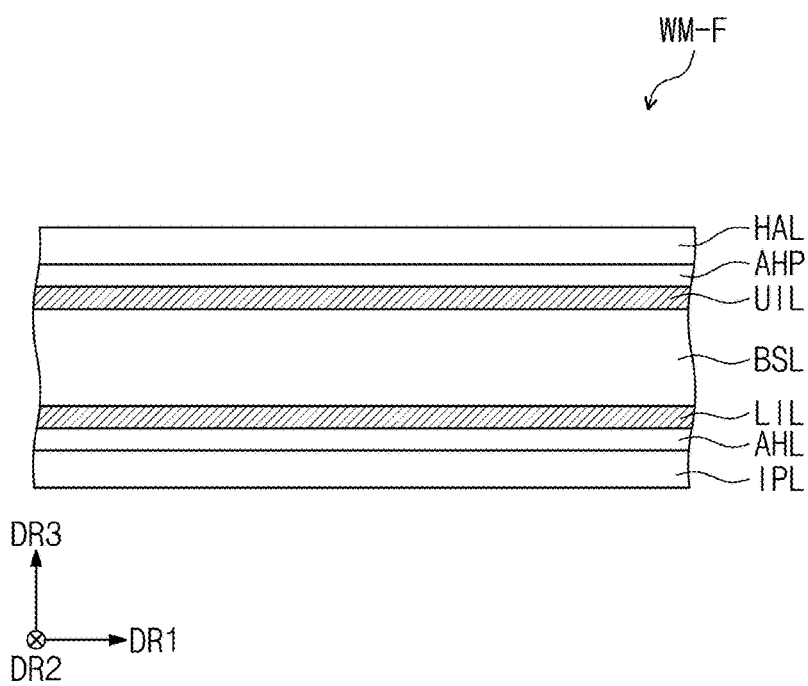
FIG. 10 is a cross-sectional view of an embodiment of a window according to the invention.
Figure 11A:
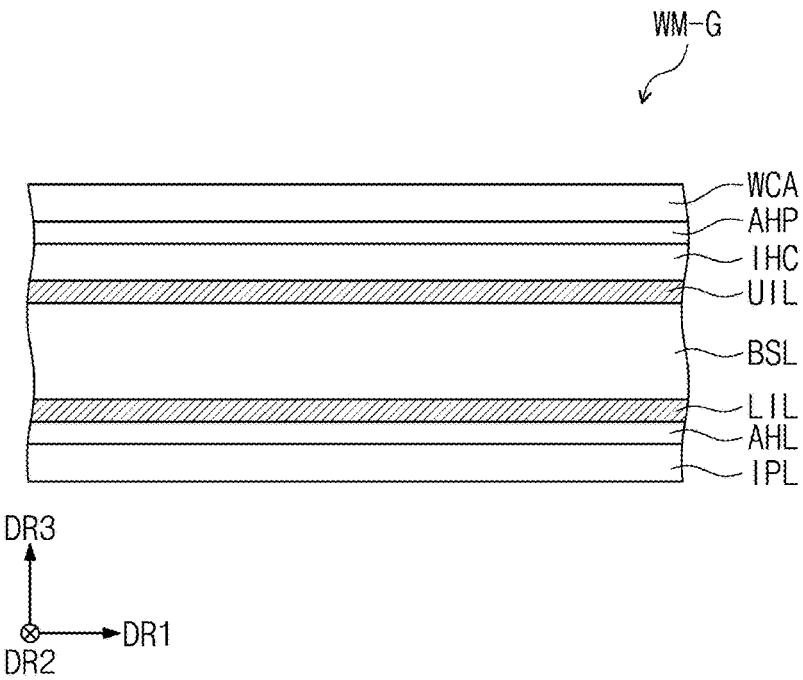
FIG. 11A is a cross-sectional view of an embodiment of a window according to the invention.
Figure 11B:
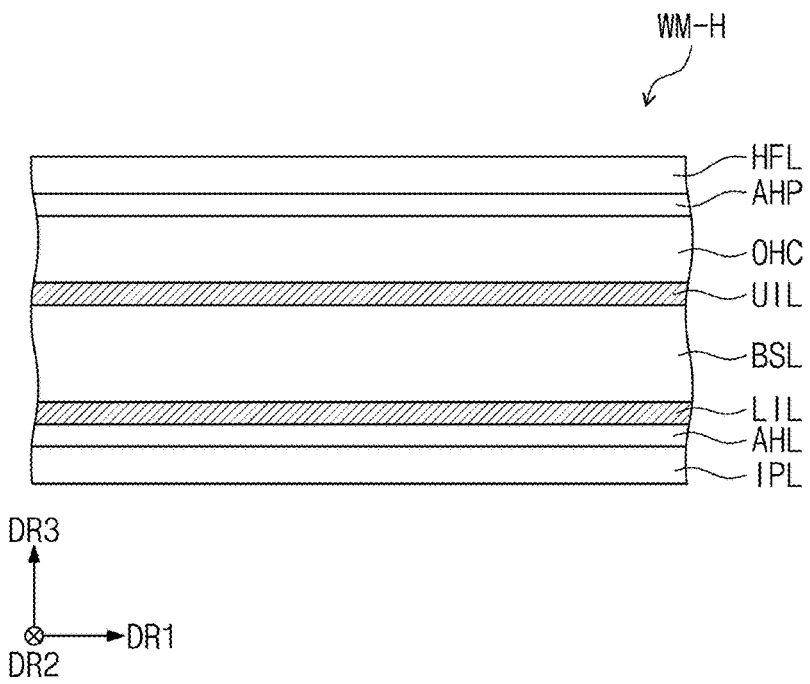
FIG. 11B is a cross-sectional view of an embodiment of a window according to the invention.

FIG. 10 is a cross-sectional view of an embodiment of a window according to the invention. FIG. 11A is a cross-sectional view of an embodiment of a window according to the invention. FIG. 11B is a cross-sectional view of an embodiment of a window according to the invention. The same/similar reference numerals are applied to the same/ similar configurations as those described in FIG. 5, and duplicate descriptions are omitted.

Referring to FIG. 10, a window WM-F according to the invention includes a base layer BSL, a protective layer HAL, a first inorganic layer UIL, and a second inorganic layer LIL.

In the illustrated embodiment, the base layer BSL may be covered by inorganic layers UIL and LIL. In an embodiment, the upper surface of the base layer BSL may be covered by the first inorganic layer UIL, and the rear surface of the base layer BSL may be covered by the second inorganic layer LIL, for example. Accordingly, the upper and rear surfaces of the base layer BSL may contact the inorganic layers UIL and LIL. In the illustrated embodiment, the first inorganic layer UIL may have a thickness of about 50 nm to about 150 nm.

The first inorganic layer UIL may include a plurality of layers U1, U2 . . . Un as the first inorganic layer UIL-A described in FIG. 6. Each of the plurality of layers U1, U2 . . . Un may include an inorganic compound. In an embodiment, each of the plurality of layers U1, U2 . . . Un may include any one among silicon nitride, silicon oxynitride, silicon oxide, zirconium oxide, and aluminum oxide, for example.

The protective layer HAL is disposed on an upper portion of the first inorganic layer UIL. The primer layer AHP may be disposed between the protective layer HAL and the first inorganic layer UIL to increase bonding strength between the protective layer HAL and the first inorganic layer UIL. In the illustrated embodiment, as the protective layer HAL is exposed at the top, the protective layer HAL may protect the base layer BSL external impacts and have anti-fingerprint properties.

In the illustrated embodiment, an organic material increasing the surface hardness of the protective layer HAL and a material having anti-fingerprint properties may be mixed to be disposed on the primer layer AHP. The material having anti-fingerprint properties may include at least any one among a metal oxide such as titanium oxide, a silicon-based compound, and a fluorine-based compound.

In the illustrated embodiment, a thinner window WM-E may be provided as the protective layer HAL in which a material increasing surface hardness and a material having anti-fingerprint properties are mixed is disposed on the outermost side.

ment, the upper surface of the base layer BSL may be covered by the first inorganic layer UIL, and the rear surface of the base layer BSL may be covered by the second inorganic layer LIL, for example. Accordingly, the upper and rear surfaces of the base layer BSL may contact the inorganic layers UIL and LIL. In the illustrated embodiment, the first inorganic layer UIL may have a thickness of about 50 nm to about 150 nm.

The first inorganic layer UIL may include a plurality of layers U1, U2 . . . Un as the first inorganic layer UIL-A described in FIG. 6. Each of the plurality of layers U1, U2 . . . Un may include an inorganic compound. In an embodiment, each of the plurality of layers U1, U2 . . . Un may include any one among silicon nitride, silicon oxynitride, silicon oxide, zirconium oxide, and aluminum oxide, for example.

The protective layer IHC is disposed on an upper portion of the first inorganic layer UIL. In the illustrated embodiment, the protective layer IHC may include an inorganic compound. In an embodiment, the protective layer IHC may include any one among inorganic compounds among silicon nitride, silicon oxynitride, silicon oxide, zirconium oxide, aluminum oxide, tantalum oxide, niobium oxide, and glass beads, for example.

The anti-fingerprint layer WCA may be disposed on an upper portion of the protective layer IHC. The primer layer AHP is disposed between the protective layer IHC and the anti-fingerprint layer WCA to increase bonding strength between the protective layer IHC and the anti-fingerprint layer WCA.

The anti-fingerprint layer WCA may be provided by applying a solution including an anti-fingerprint material. The coating method may be, as an embodiment of wet coating, spray coating applicable to forming anti-fingerprint layer WCA on the primer layer AHP. When the anti-fingerprint layer WCA is provided through a wet coating method, the protective layer HCL of the illustrated embodiment may include an inorganic compound.

The shock absorbing layer IPL is disposed on the rear surface of the base layer BSL. The shock absorbing layer IPL may be spaced apart from the base layer BSL with the second inorganic layer LIL therebetween.

TABLE 1

|  |  | TH of SAL (um) | TH of IL1 (nm) | TH of IL2 (nm) | TH of PL (um) | Method for forming AL | WVTR (g/m$^2$ · day) | Peeling of AL (yes/no) | Flexibility C/S (%) |
|---|---|---|---|---|---|---|---|---|---|
| Ex1 | 1 | ≥50 | ≤150 | ≤150 | ≥3.0 | HCAF | 10-1 | No | 3 |
|  | 2 | ≥50 | ≤20 | ≤20 | ≥3.0 | HCAF | 100 | No | 3 |
|  | 3 | ≥50 | ≤150 | ≤150 | ≥3.0 | Dry AF | 10-1 | Yes | 8 |
| Ex2 | 1 | ≥50 | ≤150 | ≤150 | ≤1.0 | Wet AF | 10-1 | No | 8 |
|  | 2 | ≥50 | ≤20 | ≤20 | ≤1.0 | Wet AF | 100 | No | 8 |
|  | 3 | ≥50 | ≤150 | ≤150 | ≤1.0 | Dry AF | 10-1 | Yes | 8 |

Referring to FIG. 11A, a window WM-G according to the invention includes a base layer BSL, a protective layer IHC, a first inorganic layer UIL, and a second inorganic layer LIL. In addition, in the illustrated embodiment, the window WM-G may further include an anti-fingerprint layer WCA, a primer layer AHP, a shock absorbing layer IPL, and an adhesive layer AHL.

In the illustrated embodiment, the base layer BSL may be covered by inorganic layers UIL and LIL. In an embodi- In Table 1, "SAL" denotes a shock absorbing layer, "IL1" denotes a first inorganic layer, "IL2" denotes a second inorganic layer, "PL" denotes a protective layer, and "AL" denotes an anti-fingerprint layer. Referring to Table 1, 1 in Example 1 ("Ex1" in Table 1) is data for an example having the same stack structure as the example for the window WM-F illustrated in FIG. 10. 2 in Example 1 differs from 1 in Example 1 in thickness ("TH" in Table 1) of an inorganic layer, and 3 in Example 1 differs from 1 in Example 1 in a method for forming an anti-fingerprint layer. As shown in 1 and 2 of Example 1, when the thickness of the first inorganic layer included in the window is about 150 nm or less, a water vapor transmission rate ("WVTR'") may be lower than the case of 20 nm or less in thickness. Accordingly, moisture introduced from the outside may be effectively blocked.

As shown in 1 and 3 of Example 1, when an anti-fingerprint layer is an anti-fingerprint layer (HCAF) including an organic material increasing surface hardness and a material having anti-fingerprint properties, peeling may be reduced compared to an anti-fingerprint layer (Dry AF) provided through a dry coating method. Peeling may be identified by determining when the coated layer is peeled when abrasion is applied while being exposed to the outside for the same time period. Accordingly, when the anti-fingerprint layer HCAF including an organic material and a material having anti-fingerprint properties is included, a window having improved durability may be provided.

1 in Example 2 ("Ex2" in Table 1) is data for an example having the same stack structure as the example for the window WM-G illustrated in FIG. 11A. 2 in Example 2 differs from 1 in Example 2 in thickness of an inorganic layer, and 3 in Example 2 differs from 1 in Example 2 in a method for forming an anti-fingerprint layer.

As shown in 1 and 2 of Example 2, when the thickness of the first inorganic layer included in the window is about 150 nm or less, a water vapor transmission rate ("WVTR") may be lower than the case of 20 nm or less in thickness. Accordingly, moisture introduced from the outside may be effectively blocked.

As shown in 1 and 3 of Example 2, when an anti-fingerprint layer (Wet AF) is provided through a wet coating method, peeling may be reduced compared to an anti-fingerprint layer provided through a dry coating method. Peeling may be identified by determining when the coated layer is peeled when abrasion is applied while being exposed to the outside for the same time period. Accordingly, when an anti-fingerprint layer includes through a wet coating method, a window having improved durability may be provided.

Referring to FIG. 11B, a window WM-H according to the invention includes a base layer BSL, a protective layer OHC, a first inorganic layer UIL, and a second inorganic layer LIL. In addition, in the illustrated embodiment, the window WM-H may further include an anti-fingerprint layer HFL, a primer layer AHP, a shock absorbing layer IPL, and an adhesive layer AHL.

In the illustrated embodiment, the base layer BSL may be covered by inorganic layers UIL and LIL. In an embodiment, the upper surface of the base layer BSL may be covered by the first inorganic layer UIL, and the rear surface of the base layer BSL may be covered by the second inorganic layer LIL, for example. Accordingly, the upper and rear surfaces of the base layer BSL may contact the inorganic layers UIL and LIL. In the illustrated embodiment, the first inorganic layer UIL may have a thickness of about 10 nm to about 25 nm.

The first inorganic layer UIL may include a plurality of layers U1, U2 . . . Un as the first inorganic layer UIL-A described in FIG. 6. Each of the plurality of layers U1, U2 . . . Un may include an inorganic compound. In an embodiment, each of the plurality of layers U1, U2 . . . Un may include any one among silicon nitride, silicon oxynitride, silicon oxide, zirconium oxide, and aluminum oxide, for example.

The protective layer OHC is disposed on an upper portion of the first inorganic layer UIL. In the illustrated embodiment, the protective layer OHC may include an organic compound. In an embodiment, the protective layer OHC may include an acrylic-based compound, an epoxy-based compound, or any combinations thereof.

The anti-fingerprint layer HFL may be disposed on an upper portion of the protective layer OHC. The primer layer AHP is disposed between the protective layer OHC and the anti-fingerprint layer HFL to increase bonding strength between the protective layer OHC and the anti-fingerprint layer HFL.

In the illustrated embodiment, a material increasing the surface hardness of the anti-fingerprint layer HFL and a material having anti-fingerprint properties may be mixed to be disposed on the primer layer AHP.

According to the windows WM-G and WM-H of the illustrated embodiment, the inclusion of the anti-fingerprint layers WAC and HFL disposed on the upper portion of the protective layers OHC and ICH, exposed to the outermost surface to increase the surface hardness, and having anti-fingerprint properties may improve pressing characteristics such as pen pressing and pen drop. In addition, as the base layer BSL is covered by the inorganic layers UIL and LIL including an inorganic compound, a function of preventing moisture transmission may be improved, and physical properties such as modulus and yield point under high temperature/high humidity conditions may be steadily maintained.

A window according to the invention includes inorganic layers covering a base layer and a protective layer, and may thus improve a function of preventing moisture transmission, and steadily maintain physical properties such as modulus and yield point in high temperature/high humidity conditions. In addition, surface hardness, and pressing characteristics such as pen pressing and pen drop may be improved, and according to the characteristic of a display device including a folding feature, the crease of the window overlapping a folded area may be reduced.

Although the invention has been described with reference to a preferred embodiment of the invention, it will be understood by those skilled in the art that various changes in form and details may be made therein without departing from the spirit and scope of the invention.

Accordingly, the technical scope of the invention is not intended to be limited to the contents set forth in the detailed description of the specification, but is intended to be defined by the appended claims.

What is claimed is:

1. A display device comprising:
   a display panel; and
   a window disposed on the display panel, the window comprising:
      a base layer comprising a first surface and a second surface opposite to each other;
      a first inorganic layer disposed on the first surface of the base layer;
      a second inorganic layer directly contacting the second surface of the base layer; and
      a protective layer disposed between the base layer and the first inorganic layer.

2. The display device of claim 1, wherein:
   the first inorganic layer comprises a plurality of layers; and
   the first inorganic layer has a total thickness of about 10 nanometers or greater.

3. The display device of claim 1, wherein:
the protective layer further comprises a protective film disposed on a first portion of the first inorganic layer, and an adhesive layer bonding the first inorganic layer and the protective film.

4. The display device of claim 1, wherein:
the protective layer further comprises an anti-fingerprint layer disposed on a first portion of the first inorganic layer, and a primer layer increasing bonding strength between the anti-fingerprint layer and the first inorganic layer.

5. The display device of claim 4, further comprising a shock absorbing layer disposed on a first portion of the second inorganic layer which is opposite to a second portion of the second inorganic layer facing the base layer, and an adhesive layer bonding the second inorganic layer and the shock absorbing layer.

6. The display device of claim 4, wherein the anti-fingerprint layer is provided from a coating solution.

7. The display device of claim 1, wherein the first inorganic layer and the second inorganic layer comprise any one among silicon nitride, silicon oxy nitride, and silicon oxide.

8. The display device of claim 1, wherein the display device is folded with respect to a folding axis extending in one direction.

9. A display device comprising:
a display panel; and
a window disposed on the display panel, the window comprising:
a base layer comprising a first surface and a second surface opposite to each other;
a first inorganic layer disposed on the first surface of the base layer;
a second inorganic layer directly contacting the second surface of the base layer; and
a protective layer disposed on a first portion of the first inorganic layer which is opposite to a second portion of the first inorganic layer facing the base layer, and
wherein the protective layer has a first thickness in a case that the protective layer includes an organic material, and has a second thickness different from the first thickness in a case that the protective layer includes an inorganic material.

10. The display device of claim 9, further comprising a primer layer increasing bonding strength between the protective layer and the first inorganic layer.

11. The display device of claim 9, further comprising a shock absorbing layer disposed on a first portion of the second inorganic layer which is opposite to a second portion of the second inorganic layer facing the base layer, and an adhesive layer bonding the second inorganic layer and the shock absorbing layer.

12. The display device of claim 9, wherein the protective layer comprises the organic material and an anti-fingerprint material which increase a surface hardness of the window.

13. The display device of claim 9, wherein the first inorganic layer comprises a plurality of layers.

14. The display device of claim 9, wherein the protective layer directly contacts the first inorganic layer.

15. The display device of claim 14, wherein the protective layer comprises the organic material, and
the protective layer further comprises an anti-fingerprint layer disposed on the protective layer, and a primer layer increasing bonding strength between the anti-fingerprint layer and the protective layer.

16. The display device of claim 15, wherein the first inorganic layer has a thickness of about 10 nanometers to about 25 nanometers.

17. The display device of claim 15, wherein the anti-fingerprint layer comprises an anti-fingerprint material.

18. The display device of claim 14, wherein the first inorganic layer comprises a plurality of layers.

19. The display device of claim 9, wherein the protective layer comprises the inorganic material,
the protective layer further comprises:
an anti-fingerprint layer disposed on the protective layer;
a primer layer increasing bonding strength between the anti-fingerprint layer and the protective layer;
the window further comprises:
a shock absorbing layer disposed on a first portion of the second inorganic layer which is opposite to a second portion of the second inorganic layer facing the base layer; and
an adhesive layer bonding the second inorganic layer and the shock absorbing layer.

20. The display device of claim 19, wherein the first inorganic layer has a thickness of about 50 nanometers to about 150 nanometers.

21. The display device of claim 19, wherein the anti-fingerprint layer is provided from a coating solution.

22. A window comprising:
a base layer comprising a first surface and a second surface opposite to each other;
a first inorganic layer disposed on the first surface of the base layer;
a second inorganic layer directly contacting the second surface of the base layer; and
a protective layer disposed between the base layer and the first inorganic layer.

23. The window of claim 22, wherein:
the first inorganic layer comprises a plurality of layers; and
the first inorganic layer has a total thickness of about 10 nanometers or greater.

24. The window of claim 22, wherein:
the protective layer further comprises a protective film disposed on a first portion of the first inorganic layer, and an adhesive layer bonding the first inorganic layer and the protective film.

25. The window of claim 22, wherein:
the protective layer further comprises an anti-fingerprint layer disposed on a first portion of the first inorganic layer, and a primer layer increasing bonding strength between the anti-fingerprint layer and the first inorganic layer.

26. The window of claim 25, further comprising a shock absorbing layer disposed on a first portion of the second inorganic layer which is opposite to a second portion of the second inorganic layer facing the base layer, and an adhesive layer bonding the second inorganic layer and the shock absorbing layer.

27. A window comprising:
a base layer comprising a first surface and a second surface opposite to each other;
a first inorganic layer disposed on the first surface of the base layer;
a second inorganic layer directly contacting the second surface of the base layer; and
a protective layer disposed on a first portion of the first inorganic layer which is opposite to a second portion of the first inorganic layer facing the base layer, and wherein the protective layer has a first thickness in a case that the protective layer includes an organic material, and has a second thickness different from the first thickness in a case that the protective layer includes an inorganic material.

28. The window of claim 27, wherein:
the protective layer further comprises:
a primer layer increasing bonding strength between the protective layer and the first inorganic layer;
a shock absorbing layer disposed on a first portion of the second inorganic layer which is opposite to a second portion of the second inorganic layer facing the base layer; and
an adhesive layer bonding the second inorganic layer and the shock absorbing layer.

29. The window of claim 28, wherein the protective layer comprises an anti-fingerprint material.

30. The window of claim 27, wherein the protective layer directly contact the first inorganic layer.

31. The window of claim 27, wherein the protective layer comprises the inorganic material, and
the protective layer further comprises an anti-fingerprint layer disposed on the protective layer, and a primer layer increasing bonding strength between the anti-fingerprint layer and the protective layer, and
the anti-fingerprint layer being provided from a coating solution.

32. The window of claim 31, wherein the first inorganic layer has a thickness of about 50 nanometers to about 150 nanometers.

33. The window of claim 27, wherein:
the protective layer comprises the organic material, and
the protective layer further comprises an anti-fingerprint layer disposed on the protective layer, a primer layer increasing bonding strength between the anti-fingerprint layer and the protective layer, and an anti-fingerprint material.

34. The window of claim 33, wherein the first inorganic layer has a thickness of about 10 nanometers to about 25 nanometers.

* * * * *